(12) United States Patent
Huang et al.

(10) Patent No.: US 11,630,147 B2
(45) Date of Patent: Apr. 18, 2023

(54) LOW-THERMAL RESISTANCE PRESSING DEVICE FOR A SOCKET

(71) Applicant: CHROMA ATE INC., Taoyuan (TW)

(72) Inventors: Ming Cheng Huang, Taoyuan (TW); Tsung-I Lin, Taoyuan (TW); Hui-Jung Wu, Taoyuan (TW); Chien-Ming Chen, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 15 days.

(21) Appl. No.: 17/551,246

(22) Filed: Dec. 15, 2021

(65) Prior Publication Data

US 2022/0206059 A1 Jun. 30, 2022

(30) Foreign Application Priority Data

Dec. 31, 2020 (TW) ................................. 109147046

(51) Int. Cl.
*G01R 31/28* (2006.01)
*G01R 1/04* (2006.01)

(52) U.S. Cl.
CPC ....... *G01R 31/2863* (2013.01); *G01R 1/0458* (2013.01); *G01R 1/0466* (2013.01)

(58) Field of Classification Search
CPC . G01R 1/0458; G01R 1/0466; G01R 31/2863

USPC ..................................................... 324/756.02
See application file for complete search history.

(56) References Cited

U.S. PATENT DOCUMENTS

2003/0169062 A1* 9/2003 Moushon ............. G01R 1/0466
324/750.25

* cited by examiner

*Primary Examiner* — Lee E Rodak
*Assistant Examiner* — Courtney G McDonnough
(74) *Attorney, Agent, or Firm* — McClure, Qualey & Rodack, LLP

(57) ABSTRACT

The present invention relates to a low-thermal resistance pressing device for a socket, which mainly comprises a housing, an inner collar, a heat conductive pressing block, a bearing collar and a locking member. The locking member on the housing is used to lock the socket. The inner collar is threadedly engaged with the housing. The bearing collar is located between the inner collar and the heat conductive pressing block. In the case of rotating the inner collar in the housing, the bearing collar drives the heat conductive pressing block to move axially so as to exert an axial force to a device to be tested. Because the heat conductive pressing block protrudes from the upper and lower surfaces of the housing, one end thereof can be in contact with a temperature control module, and the other end thereof can be in contact with the device to be tested.

10 Claims, 9 Drawing Sheets

LOW-THERMAL RESISTANCE PRESSING DEVICE FOR A SOCKET

BACKGROUND OF THE INVENTION

Field of the Invention

The present invention relates to a low-thermal resistance pressing device for a socket, in particular to a low-thermal resistance pressing device for a socket which is directly coupled to the socket and can be moved with the socket and apply a pressing force to a device to be tested.

Description of the Related Art

Development of chip test jigs, chip test equipment or chip test methods is diversified to meet various needs. A manual lid is also a very important test jig, which is cooperated with a socket for manual engineering verification test. A knob of the manual lid is manually or automatically rotated to apply a pressing force to a chip to be tested in the socket so as to ensure that all of contacts of the chip are in electric contact with probes in the socket.

Reference is made to FIG. 1A, which is a schematic cross-sectional view showing a conventional manual lid 10 connected to a socket S. In the case that the pawls 11 of the conventional manual lid 10 are engaged with locking recesses S1 on two sides of the socket 5, a knob 12 is manually rotated. The knob 12 threadedly engaged with a body 13, and a rotary bearing 15 is provided between the lower end surface of the knob 12 and a pressing plate 14. Therefore, with the rotation of the knob 12, the knob 12 descends with respect to the body 13 and pushes the pressing plate 14 so that a pressing block 16 under the pressing plate 14 pushes a chip C1 so as to ensure that the chip C1 are in electrical contact with probes of the socket C.

However, as the chip C1 to be tested becomes more powerful, great heat is generated by the chip C1 during operation thereof resulting in the high temperature of the chip C1. The heat dissipation mechanism of the manual lid 10 becomes very important. Typically, a finned heat sink and a fan are directly arranged on the manual lid, for example, in Taiwanese Utility Model Patent No. M340550, entitled "Manual test apparatus of semiconductor measurement stage". However, this conventional device is bulky and has a bad heat dissipation property.

For the conventional manual lid 10 shown in FIG. 1A, it is preferable to connect a temperature control module 17, which can be a heat exchange module through which cooling water circulation or coolant is circulated, directly above the knob 12. According to general test requirements, the chip C1 produces 500 W of heat, and the maximum temperature does not exceed 125° C. On the other hand, if the temperature of the fluid Flowing through the temperature control module 17 is 15° C., the thermal resistance of the conventional manual lid 10 must be less than 0.221 K/W. If the thermal resistance of the conventional manual lid 10 is greater than 0.22 K/W, the temperature of the chip C1 would be higher than 125° C. At this time, not only the test requirements cannot be fulfilled, but also the chip C1 is overheated and broken at worst.

As can be seen from FIG. 1B which is a schematic diagram of a thermal resistance model of the conventional manual lid 1, the entire conventional manual lid 10 has four contact interfaces. It means that, as shown in the figure, there are four contact interface thermal resistors R1~R4, including the contact interface thermal resistor R1 between the temperature control module 17 and the knob 12, the contact interface thermal resistor R2 between the knob 12 and the pressing plate 14 (i.e. the thermal resistor of the rotary bearing 15), the contact interface thermal resistor R3 between the pressing plate 14 and the pressing block 16, and the contact interface thermal resistor R4 between the pressing block 16 and the chip C1. Theoretically, the contact interface thermal resistance between metal and metal is about 0.2° C./W. Therefore, the thermal resistance of the conventional manual lid 10 would be 0.8° C./W, which is much higher than 0.22° C./W mentioned in the previous paragraph. As a result, it is obvious that good heat transfer performance cannot be provided, and the temperature rise of the chip C1 cannot be effectively suppressed.

SUMMARY OF THE INVENTION

The main object of the present invention is to provide a low-thermal resistance pressing device for a socket, which can provide an excellent heat conduction effect and can be used with a temperature control module to effectively heat or cool a device to be tested.

In order to achieve the above object, a low-thermal resistance pressing device for a socket of the present invention, which is used to be connected to the socket, in which a device to be tested is accommodated, comprises a housing, an inner collar, a heat conductive pressing block, a bearing collar and at least one locking member, wherein the housing includes an axial through hole formed with an internal thread and perforating through an upper surface and a lower surface of the housing; the inner collar is accommodated in the axial through hole and formed with an external thread, which is threadedly engaged with the internal thread of the housing; the heat conductive pressing block extends through the inner collar and protrudes from the upper surface and the lower surface of the housing; the bearing collar is located between the inner collar and the heat conductive pressing block; and the at least one locking member is assembled on the housing. When the socket is locked by the locking member, rotating the inner collar causes a lower surface of the heat conductive pressing block to be brought into contact with the device to be tested and generates an axial force to the heat conductive pressing block so that the axial force is exerted on the device to be tested through the heat conductive pressing block.

With aid of engagement of the external thread of the inner collar with the internal thread of the housing, when the inner collar is rotated, the inner collar is axially displaced with respect to the housing through the internal and external threads, thereby moving the bearing collar and the heat conductive pressing block toward or away from the device to be tested. The bearing collar functions to isolate the rotation so that the heat conductive pressing block is axially displaced without being rotated. Because the heat conductive pressing block protrudes from the upper and lower surfaces of the housing, one end thereof can be in contact with a temperature control module, and the other end thereof can be in contact with the device to be tested. In this way, the thermal resistance of the contact interface can be reduced to a minimum and the heat conduction effect is greatly improved.

The low-thermal resistance pressing device for a socket of the present invention further comprises an outer rotating ring and a pressing ring. The outer rotating ring can be coupled to the upper surface of the inner collar, the pressing ring can be accommodated in the inner collar between the bearing collar and the heat conductive pressing block, and the heat conductive pressing block can extend through the outer rotating ring and the pressing ring. In other words the outer rotating ring can be used as a connection interface for coupling with a cap that can be applied with a turning force, a hand tool or an electric tool, and the pressing ring can be used as a member for applying a force to the heat conductive pressing block. The heat conductive pressing block includes a coaxial portion and an arc-shaped flared portion, wherein the coaxial portion can extend through the pressing ring, the bearing collar, the inner collar and the outer rotating ring, and the pressing ring includes an inner circle arc face abutted against the arc-shaped flared portion.

Preferably, the low-thermal resistance pressing device for a socket of the present invention further comprises an upper retaining ring and a lower retaining ring. The upper retaining ring is fitted on the heat conductive pressing block and abutted against the upper surface of the inner collar, and the lower retaining ring is assembled on the lower surface of the inner collar for retaining the pressing ring. The present invention can prevent the heat conductive pressing block from falling off from the pressing ring, the bearing collar and the inner collar through the upper retaining ring and the lower retaining ring.

The bearing collar of the present invention can be a thrust bearing, which can not only isolate the rotational movement of the inner collar but also bear an axial load. Moreover the coaxial portion of the heat conductive pressing block is spaced by a specific clearance from the pressing ring, the bearing collar and the inner collar. This arrangement allows the heat conductive pressing block to conform to the contact interface between the heat conductive pressing block and the device to be tested and to be inclined by a specific angle with respect to the pressing ring, the bearing collar, the inner collar and the outer rotating ring so that the force applied to the device to be tested by the heat conductive pressing block is uniformly maintained in a normal direction. Briefly, the specific clearance allows the heat conductive pressing block to conform to the flatness of the contact interface between the heat conductive pressing block and the device to be tested and to adaptively adjust the angle so as to maintain complete contact between the heat conductive pressing block and the device to be tested and to maintain a uniform force and constant heat exchange on the surface of the device to be tested.

Furthermore, the heat conductive pressing block of the present invention may also include a coaxial portion, a stepped portion and an obliquely flared portion, wherein the stepped portion is located between the coaxial portion and the obliquely flared portion. The low-thermal resistance pressing device for a socket of the present invention may further comprise a fixing ring, which is fitted on the coaxial portion of the heat conductive pressing block. The bearing collar may be a fish-eye bearing, which includes a bearing inner convex race and a bearing outer concave race, wherein the bearing inner convex race is fitted on the coaxial portion, one end of the bearing inner convex race is abutted against the fixing ring, the other end of the bearing inner convex race is abutted against the stepped portion, and the bearing outer concave race is coupled to the bearing inner convex race and connected to the inner collar. Accordingly, the present invention can also bear an axial load and isolate the rotation of the inner collar by means of the fish-eye bearing, and the fixing ring can be used to fix the bearing inner convex race of the fish-eye bearing to the heat conductive pressing block.

Moreover, the fixing ring of the present invention can be accommodated in the inner collar, and a specific clearance can be maintained between the fixing ring and the inner collar, thereby correcting the error of the contact interface between the heat conductive pressing block and the device to be tested. More specifically, the characteristic of the fish-eye bearing allows the bearing inner convex race to be swung and rotated with respect to the bearing outer concave race, and the clearance between the fixing ring and the inner collar provides a space for swinging movement and rotating movement of the heat conductive pressing block. Therefore, once there is an angle error in the contact interface between the heat conductive pressing block and the device to be tested, the fish-eye bearing can adaptively adjust the swing angle of the heat conductive pressing block so that the force applied to the device to be tested by the heat conductive pressing block is uniformly maintained in a normal direction while good heat exchange on the surface of the device to be tested can be also maintained.

In addition, the bearing collar of the present invention can be a spherical roller thrust bearing, which includes an upper race, a lower race and a plurality of oblique rollers. The upper race and the lower race can be fitted on the coaxial portion of the heat conductive pressing block, The upper ace is connected to the inner collar, the lower race is abutted against the stepped portion, and the plurality of oblique rollers are arranged between the upper race and the lower race. In other words, the present invention can also use the spherical roller thrust bearing to bear an axial load and isolate the rotation of the inner collar and can adaptively adjust the angle of the contact interface between the heat conductive pressing block and the device to be tested so that the force applied to the device to be tested by the heat conductive pressing block is uniformly maintained in a normal direction.

The low-thermal resistance pressing device for a socket of the present invention can further comprise a temperature control module, which is arranged above the housing and in contact with the heat conductive pressing block. Briefly, according to the present invention, only the heat conductive pressing block is interposed between the temperature control module and the device to be tested so the thermal resistance of the contact interface can be reduced to a minimum and the heat conduction effect is significantly improved to effectively heat or cool the device to be tested.

DESCRIPTION OF THE PREFERRED EMBODIMENTS

Figure 1A:
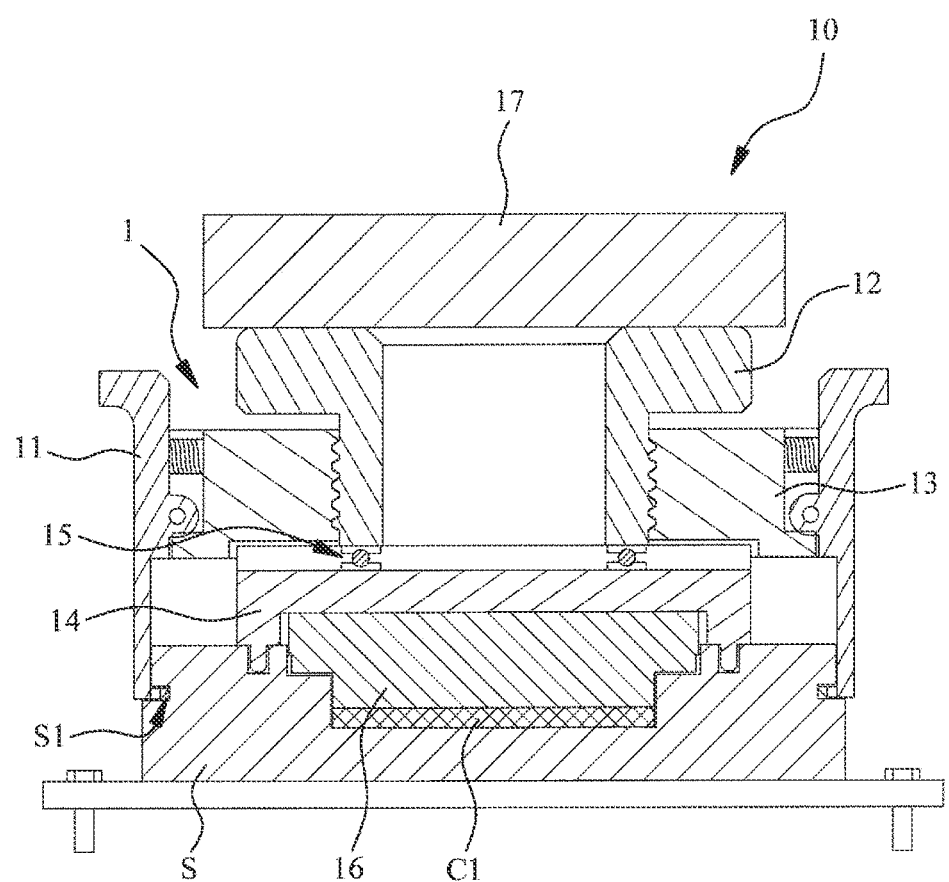
FIG. 1A is a schematic cross-sectional view of a conventional manual lid.
Figure 1B:
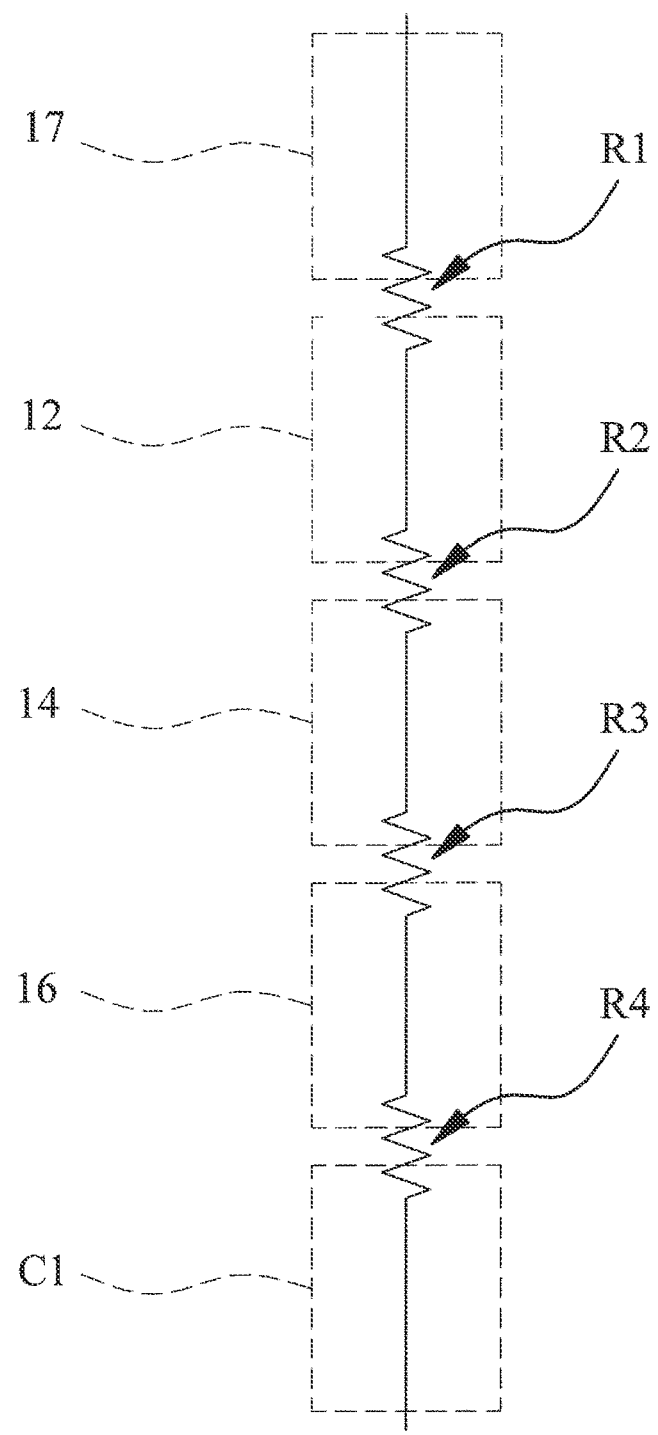
FIG. 1B is a schematic diagram showing a thermal resistance model of the conventional manual lid.

Before a low-thermal resistance pressing device for a socket of the present invention is described in detail in the present embodiments, it should be particularly noted that in the following description, similar components will be designated by the same numeral reference. Furthermore, the drawings of the present invention are only for illustrative purposes and are not necessarily drawn to scale, and not all details are necessarily presented in the drawings.

Figure 2A:
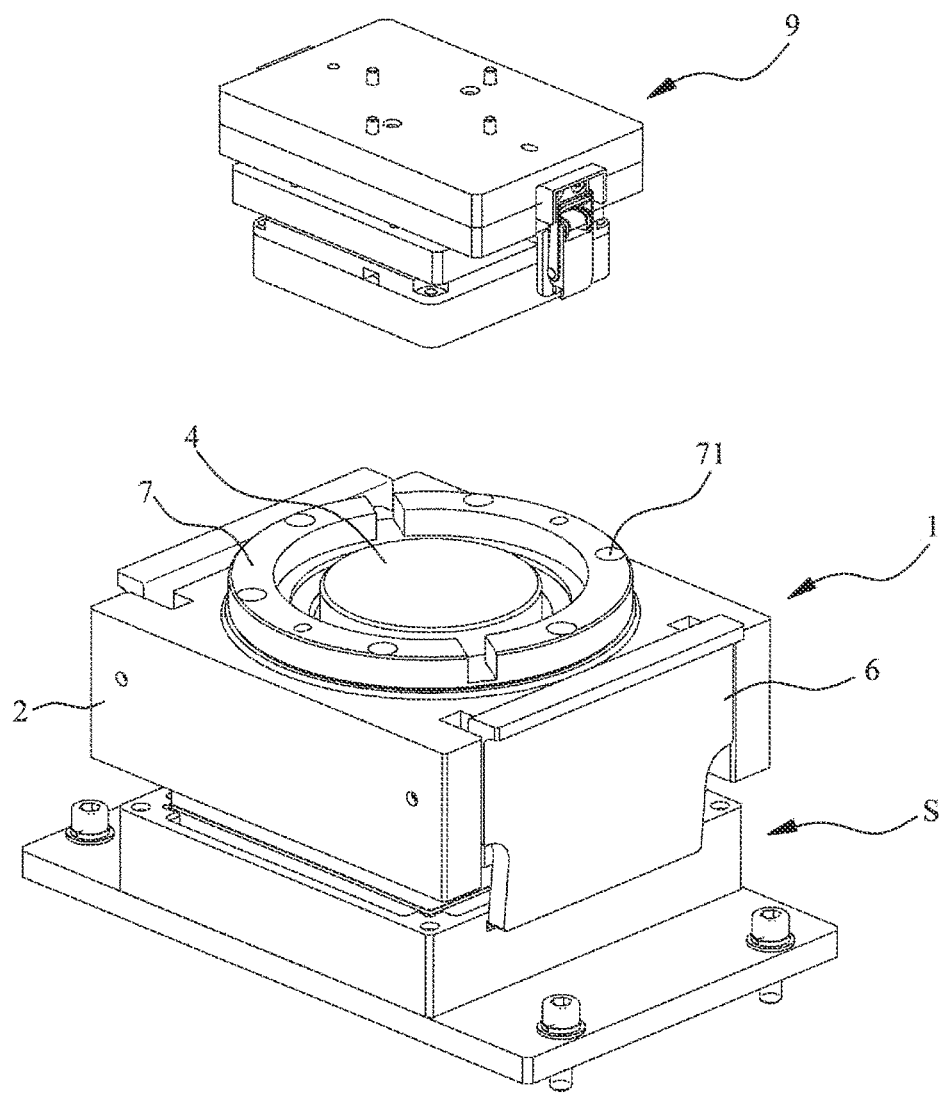
FIG. 2A is a perspective view of a first embodiment of the present invention.
Figure 2B:
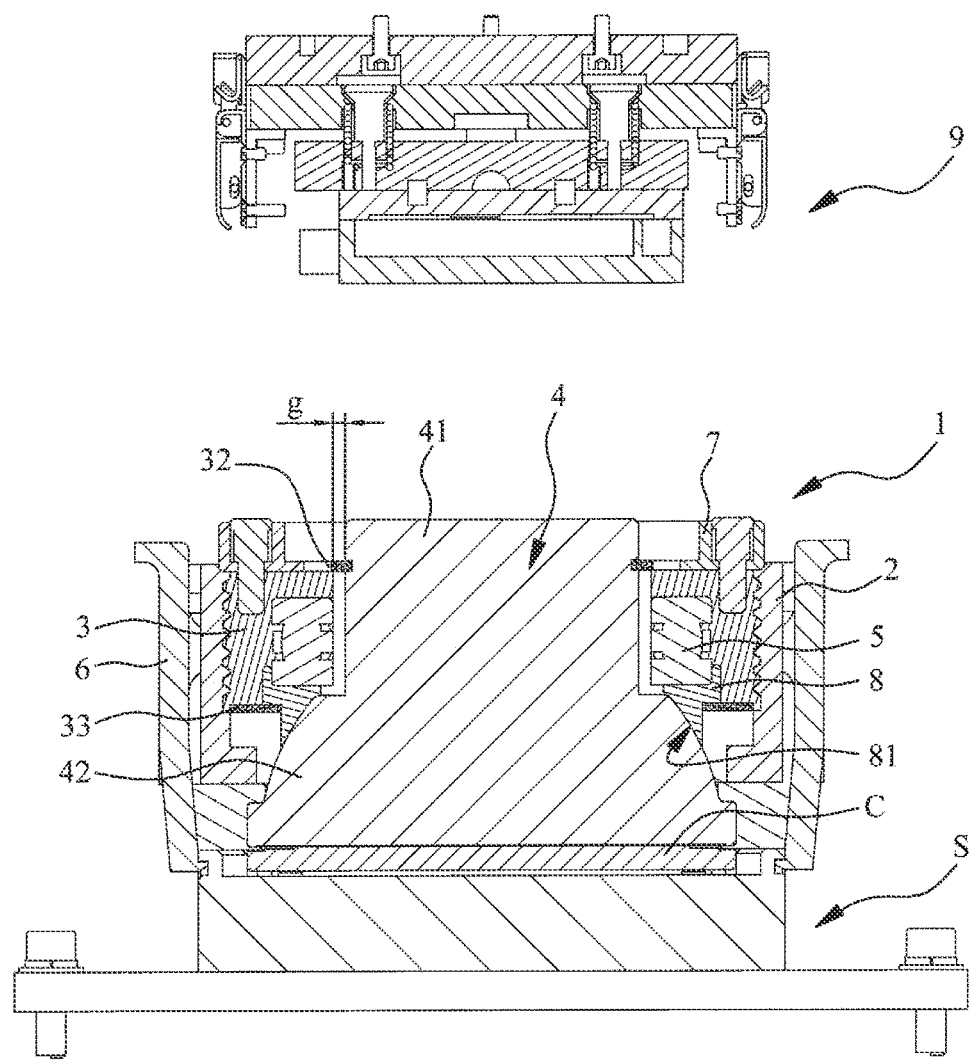
FIG. 2B is a cross-sectional view of the first embodiment of the present invention.
Figure 2C:
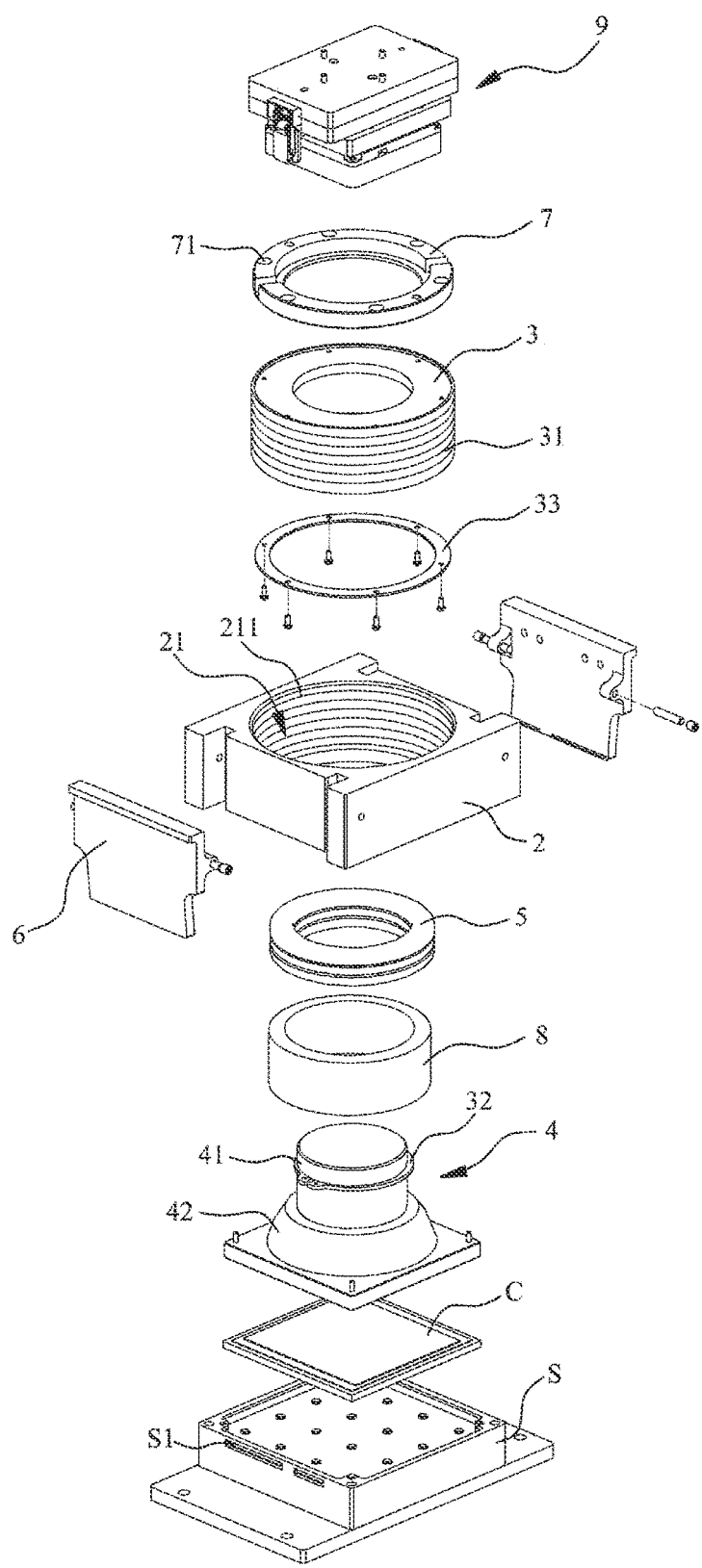
FIG. 2C is an exploded view of the first embodiment of the present invention.

Reference is made to FIGS. 2A, 2B and 2C. FIG. 2A is a perspective view of a first embodiment of the present invention, FIG. 2B is a cross-sectional view of the first embodiment of the present invention, and FIG. 2C is an exploded view of the first embodiment of the present invention. As shown in the figures, a temperature control module 9 can be connected to the top of the low-thermal resistance pressing device 1 for a socket of this embodiment. In order to clearly show the connection relationship among the various components, the temperature control module 9 is detached from the pressing device 1 for a socket in the figures. The temperature control module 9 of this embodiment can be a heat exchanger through which a temperature control fluid is circulated or an evaporator through which a coolant is circulated. In addition, the bottom of the lower thermal resistance pressing device 1 for a socket can be engaged with a socket S, and a device to be tested C is accommodated in the socket S.

As shown in the figures, the low-thermal resistance pressing device 1 for a socket of the first embodiment of the present invention mainly comprises a housing 2, an inner collar 3, a heat conductive pressing block 4, a bearing collar 5, locking members 6, an outer rotating ring 7, a pressing ring 8, an upper retaining ring 32 and an lower retaining ring 33. The housing 2 has an axial through hole 21, which perforates through the upper and lower surfaces of the housing 2, and an internal thread 211 is formed in the axial through hole 21. Furthermore, the inner collar 3 is accommodated in the axial through hole 21, and the outer surface of the inner collar 3 is formed with an external thread 31, which is threadedly engaged with the internal thread 211 of the axial through hole 21 of the housing 2.

The top of the inner collar 3 is connected to the outer rotating ring 7, wherein the outer rotating ring 7 is attached on the inner collar 3 by means of screws, and the upper surface of the outer rotating ring 7 is formed with six insertion holes 71 for insertion of a turning tool (not shown). In other words, a hand tool or an electric tool can be directly connected to the outer rotating ring 7 through the insertion holes 71, and the outer rotating ring 7 is rotated by the tool, thereby rotating the inner collar 3.

Furthermore, the inner collar 3 is internally equipped with a bearing collar 5 and a pressing ring 8. The bearing collar 5 of this embodiment is a thrust bearing, the upper end surface of which is connected to the inner collar 3, and the lower end surface of which is connected to the pressing ring. On the other hand, the heat conductive pressing block 4 of this embodiment includes a coaxial portion 41 and an arc-shaped flared portion 42, and the coaxial portion 41 extends through the pressing ring 8, the bearing collar 5, the inner collar 3 and the outer rotating ring 7 in sequence. The pressing ring 8 includes an inner circle arc surface 81, which is abutted against the arc-shaped flared portion 42.

In this embodiment, the upper retaining ring 32 is fitted on the heat conductive pressing block 4 and is abutted against the upper surface of the inner collar 3. The lower retaining ring 33 is assembled on the lower surface of the inner collar 3 for retaining the pressing ring 8. Accordingly, in this embodiment, the upper retaining ring 32 and the lower retaining ring 33 are used to prevent the heat conductive pressing block 4 from falling off from the pressing ring 8, the bearing collar 5 and the inner collar 3. Also, the lower retaining ring 33 can prevent the pressing ring 8 and the bearing collar 5 from falling off from the inner collar 3.

The two locking members 6 shown in the figures are respectively arranged on two opposite sides of the housing 2. Each locking member 6 is hinged to the housing 2, wherein one end of the locking member 6 can be operated manually, and the other end of the locking member 6 can be selectively engaged with or detached from a corresponding locking recess S1 on one of both sides of the socket S by manually operating the one end of the locking member 6.

The operation mode of this embodiment will be described below. First, the low-thermal resistance pressing device 1 for a socket is connected to the socket S, and the two locking members 6 are engaged with the locking recesses S1 on the two sides of the socket S respectively, Furthermore, a hand tool or an electric tool (not shown) is coupled to the outer rotating ring 7 and then rotates the outer rotating ring 7. At this time, the outer rotating ring 7 drives the inner collar 3 to rotate with respect to the housing 2 and drive the bearing collar 5, the pressing ring 8 and the heat conductive pressing block 4 to move toward the socket S, thereby bringing the heat conductive pressing block 4 into contact with the device to be tested C and generating an axial force. The axial force is applied to the device to be tested C through the heat conductive pressing block 4. The axial force increases with rotation of the outer rotating ring 7. The thrust bearing serving as the bearing collar not only bears the pressing force from the inner collar 3, but also isolates the rotational movement of the inner collar 3, that is, the pressing ring 8 and the heat conductive pressing block 4 would not rotated with the inner collar 3.

It should be noted that in this embodiment, the outer circle surface of the coaxial portion 41 of the heat conductive pressing block 4 is spaced by a specific clearance g from the inner circle surfaces of the pressing ring 8, the bearing collar 5 and the inner collar 3 so the heat conductive pressing block 4 can be slightly swung for the purpose of allowing the heat conductive pressing block 4 to conform to the contact interface between the heat conductive pressing block 4 and the device to be tested C and to be inclined by a specific angle with respect to the pressing ring 8 and the bearing collar 5 and the inner collar 3. In this embodiment, the heat conductive pressing block 4 can be swung by about 1 degree. In other words, with aid of the specific clearance g, the heat conductive pressing block 4 is allowed to adaptively adjust its angle so as to conform to the condition of the contact surface between the heat conductive pressing block 4 and the device to be tested C. As a result, the heat conductive pressing block 4 can be in contact with the device to be tested C. Even if the upper surface of the device to be tested C or the lower surface of the heat conductive pressing block 4 has a flatness error, the lower surface of the heat conductive pressing block 4 can be brought into uniform contact with the upper surface of the device to be tested C so as to provide a uniform heat exchange effect and a constant pressing force to the device to be tested C.

Furthermore, in order to prove that the thermal resistance in this embodiment is extremely low and it can provide an excellent temperature control effect for the device to be tested, simulation analysis data and related simulation parameters are provided as follows. The device to be tested C generates 500 W of heat; the temperature of the circulating water in the temperature control module 9 is 15° C.; the flow rate of the circulating water is set to 0.1 LPM, 0.11 LPM, 0.15 LPM, 0.5 LPM; the ambient temperature is 25° C.; and the heat conductive pressing block 4 is made of pure copper.

According to the result of simulation analysis, when the flow rate of the circulating water is 0.1 LPM, the surface average temperature of the upper surface of the heat conductive pressing block 4 in contact with the temperature control module 9 is 87.7° C., and the surface average temperature of the upper surface of the device to be tested C in contact with the heat conductive pressing block 4 is 106.9° C. It can be obtained that the thermal resistance of the contact interface between the device to be tested C and the heat conductive pressing block 4 is 0.0384° C./W, and the thermal resistance of the contact interface between the heat conductive pressing block 4 and the temperature control module 9 is 0.1603° C./W. The sum of the two thermal resistances is still less than 0.22° C./W so this embodiment can indeed effectively suppress the operating temperature of the device to be tested below 125° C. Other simulation parameters and the results obtained are listed in the following table. It can be seen from the table that when the flow rate of the circulating water is 0.11 LPM, an acceptable thermal resistance can be obtained while the pressure drop of the temperature control module (evaporator) is still within an acceptable range.

the bearing collar 5. The bearing collar 5 is a fish-eye bearing, which includes a bearing inner convex race 51 and a bearing outer concave race 52, wherein the bearing inner convex race 51 is fitted on the coaxial portion 41. The upper end surface of the bearing collar 5 is abutted against the fixing ring 34 while the lower end surface of the bearing collar 5 is abutted against the stepped portion 44. The bearing outer concave race 52 is coupled to the bearing inner convex race 51 and connected to the inner collar 3. In this embodiment, the fish-eye bearing is used to bear an axial load, that is, to transmit the force from the inner collar 3, and to isolate the rotational movement of the inner collar 3, and the fixing ring 34 can be used to fix the bearing inner convex race 51 of the fish-eye bearing to the heat conductive pressing block 4.

In addition, the fixed ring 34 of this embodiment is accommodated in the inner collar 3, and a specific clearance g is maintained between the fixing ring 34 and the inner collar 3 so as to correct the flatness error of the contact interface between the heat conductive pressing block 4 and the device to be tested C. Due to the characteristic of the fish-eye bearing, the bearing inner convex race 51 can be swung and rotated with respect to the bearing outer concave race 52, and the specific clearance g between the fixing ring 34 and the inner collar 3 provides a space for swinging movement and rotational movement of the heat conductive pressing block 4. Therefore, if the contact interface between the heat conductive pressing block and the device to be tested C has a flatness (angle) error, the fish-eye bearing can adaptively adjust the angle so that the force applied to the device to be tested C by the heat conductive pressing block 4 is uniformly maintained in a normal direction while an excellent heat exchange efficiency can be maintained. In this

| The flow rate of circulating water | The thermal resistance of the contact interface between the device to be tested and the heat conductive pressing block (° C./W) | The thermal resistance of the contact interface between the heat conductive pressing block and the temperature control module (° C./W) | The pressure drop of the temperature control module (evaporator) (pa) |
|---|---|---|---|
| 0.10 LPM | 0.0384 | 0.1603 | 129 |
| 0.11 LPM | 0.0382 | 0.1540 | 188 |
| 0.15 LPM | 0.0384 | 0.1047 | 407 |
| 0.50 LPM | 0.0382 | 0.0392 | 5095 |

Figure 3A:
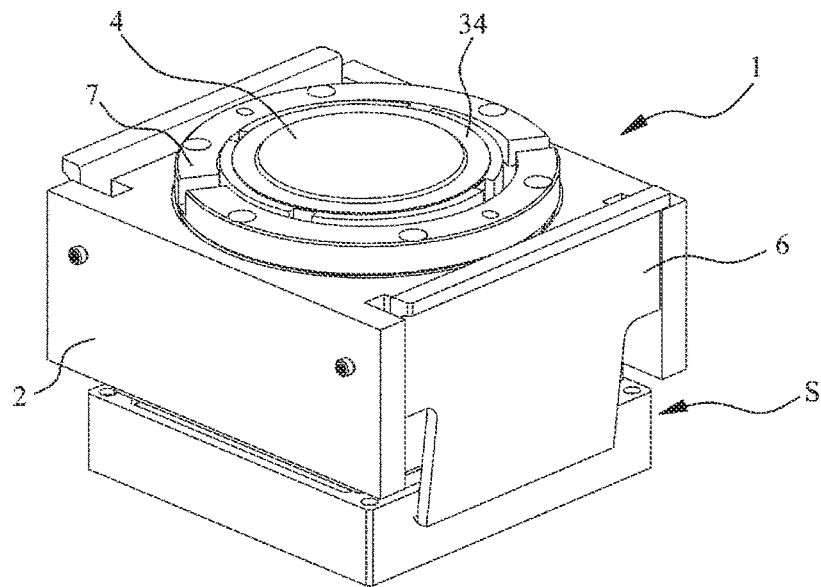
FIG. 3A is a perspective view of a second embodiment of a low-thermal resistance pressing device for a socket of the present invention.
Figure 3B:
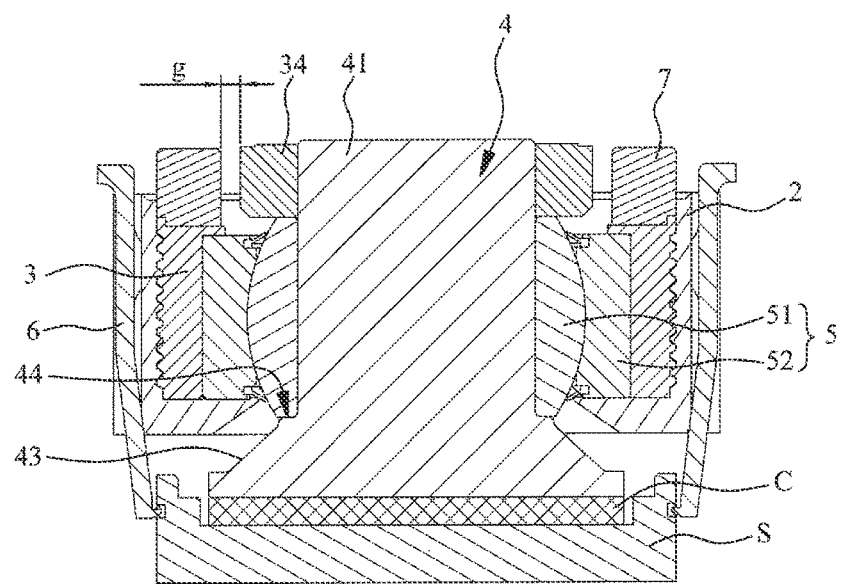
FIG. 3B is a cross-sectional view of the second embodiment of the low-thermal resistance pressing device for a socket of the present invention.
Figure 3C:
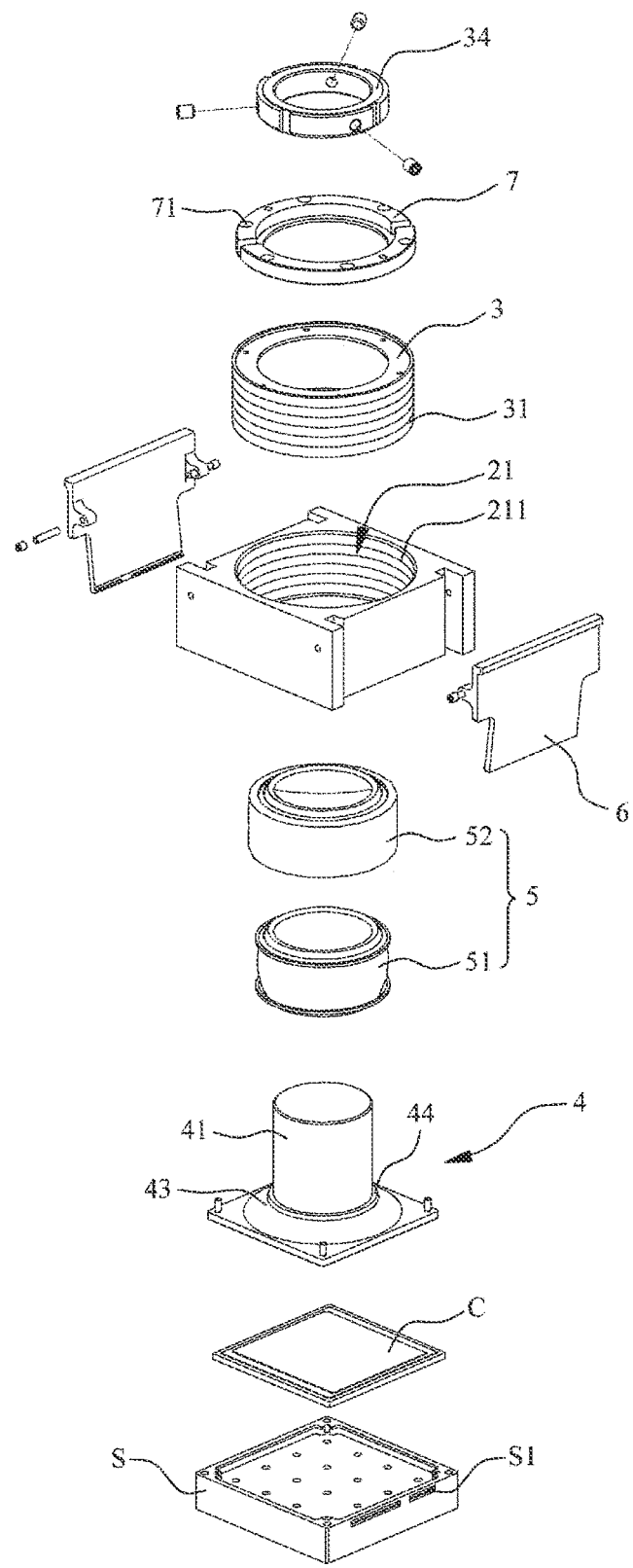
FIG. 3C is an exploded view of the second embodiment of the low-thermal resistance pressing device for a socket of the present invention.

Reference is made to FIGS. 3A, 3B and 3C. FIG. 3A is a perspective view of a second embodiment of the low-thermal resistance pressing device for a socket of the present invention, FIG. 3B is a cross-sectional view of the second embodiment of the low-thermal resistance pressing device for a socket of the present invention, and FIG. 3C is an exploded view of the second embodiment of the low-thermal resistance pressing device for a socket of the present invention. The main difference between the second embodiment and the first embodiment lies in the form of the bearing collar 5. This embodiment adopts a fish-eye bearing.

Figure 4A:
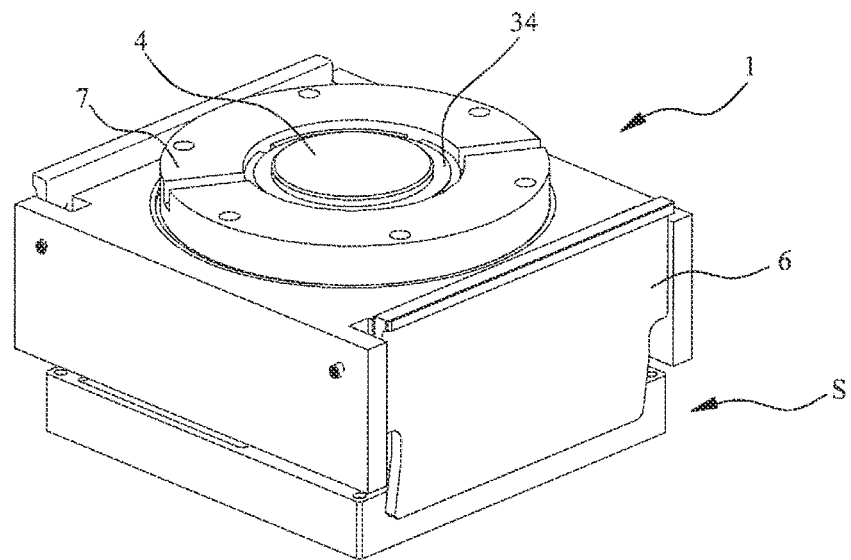
FIG. 4A is a perspective view of a third embodiment of the low-thermal resistance pressing device for a socket of the present invention.
Figure 4B:
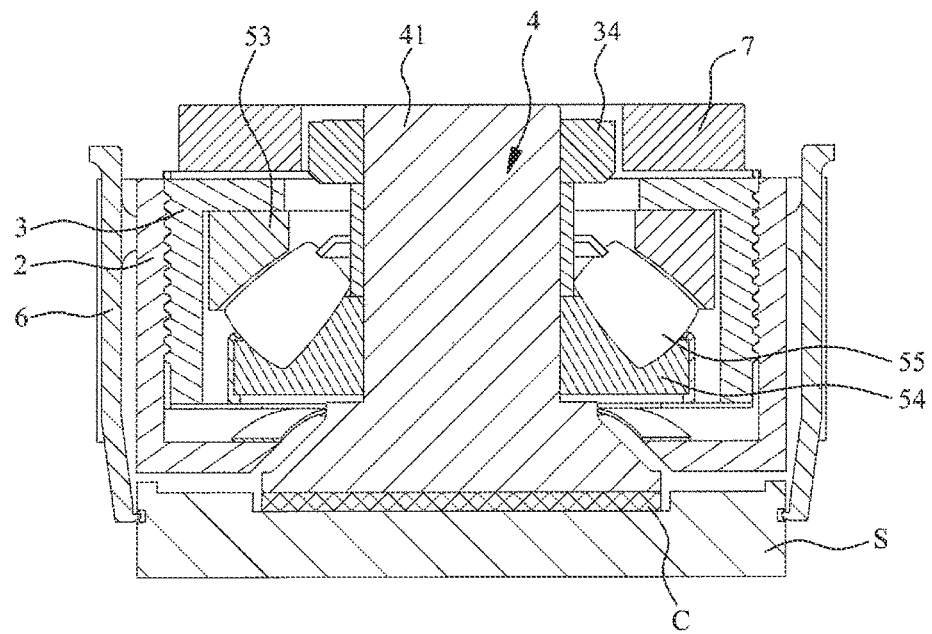
FIG. 4B is a cross-sectional view of the third embodiment of the low-thermal resistance pressing device for a socket of the present invention.
Figure 4C:
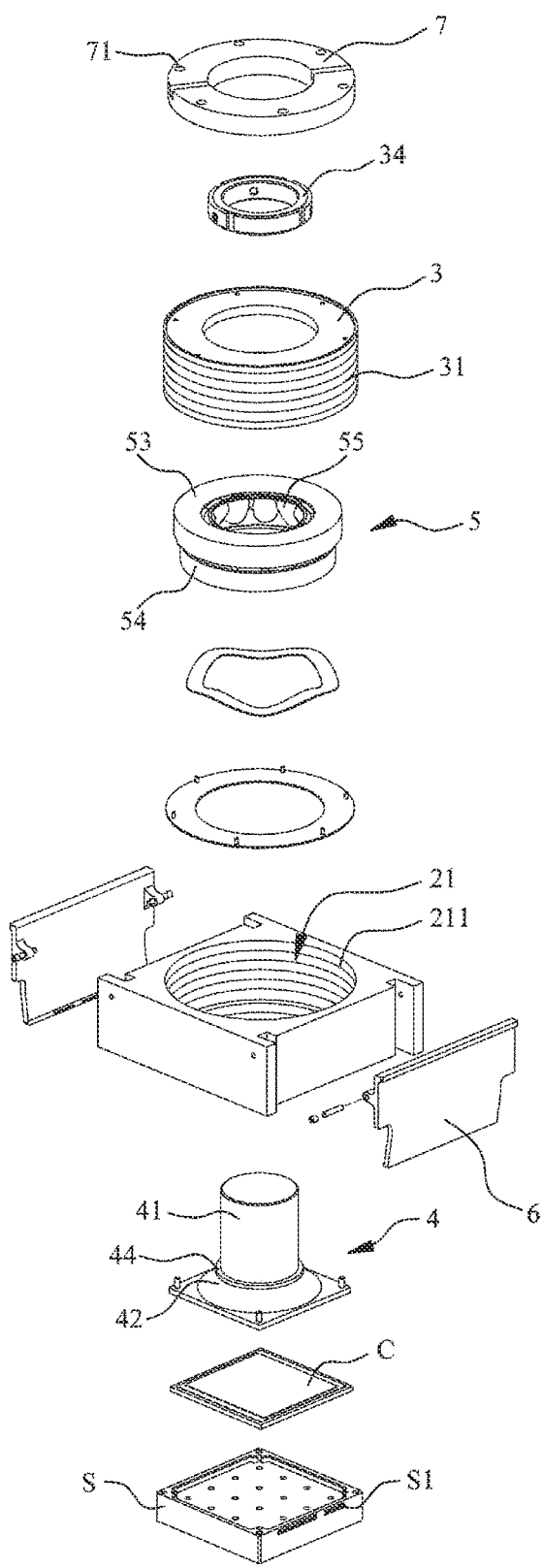
FIG. 4C is an exploded view of the third embodiment of the low-thermal resistance pressing device for a socket of the present invention.

The heat conductive pressing block 4 of the second embodiment is also slightly different from that of the first embodiment. The heat conductive pressing block 4 of this embodiment includes a coaxial portion 41, a stepped portion 44 and an obliquely flared portion 43, wherein the stepped portion 44 is located between the coaxial portion 41 and the obliquely flared portion 43. This embodiment further includes a fixing ring 34, which is fitted on the coaxial portion 41 of the heat conductive pressing block 4 for fixing embodiment, the heat conductive pressing block 4 can be swung by about 3~4 degrees, Reference is made to FIGS. 4A, 4B and 4C. FIG. 4A is a perspective view of a third embodiment of the low-thermal resistance pressing device for a socket of the present invention, FIG. 4B is a cross-sectional view of the third embodiment of the low-thermal resistance pressing device for a socket of the present invention, and FIG. 4C is an exploded view of the third embodiment of the low-thermal resistance pressing device for a socket of the present invention. The third embodiment is different from the first and second embodiments in the form of the bearing collar 5. This embodiment adopts a spherical roller thrust bearing.

In detail, this embodiment also includes a fixing ring 34, which is fitted on the coaxial portion 41 of the heat conductive pressing block 4, The bearing collar 5 of this embodiment is a spherical roller thrust bearing, which includes an upper race 53, a lower race 54 and a plurality of oblique rollers 55, wherein the upper race 53 and the lower race 54 are fitted on the coaxial portion 41 of the heat conductive pressing block 4, the upper race 53 is connected to the inner collar 3, the lower race 54 is abutted against the stepped portion 44, and the plurality of oblique rollers 55 are arranged between the upper race 3 and the lower race 54.

Similar to the first and second embodiments, this embodiment can also use the spherical roller thrust bearing to bear an axial load (that is, a pressing force to be applied to the device to be tested C) and to isolate the rotational movement of the inner collar 3, and the spherical roller thrust bearing can be used to adaptively adjust the flatness (angle) of the contact interface between the heat conductive pressing block and the device to be tested so that the force applied to the device to be tested by the heat conductive pressing block is uniformly maintained in a normal direction.

In summary, these embodiments have at least the following advantages:

(1) an integrated heat conductive pressing block can be used to reduce the number of total contact interfaces and to form a heat conduction structure with a few layers, which can significantly reduce thermal resistance and greatly improve the heat exchange effect, so as to effectively heat or cool the device to be tested;

(2) the heat conductive pressing block can adaptively adjust its own swinging angle according to the flatness (angle) of the contact interface between the heat conductive pressing block and the device to be tested so as to bring the lower surface of the heat conductive pressing block into contact with the device to be tested, thereby providing a uniform pressing force and a constant heat exchange effect;

(3) the outer thread of the inner collar and the inner thread of the housing have a self-locking mechanism, that is, an axial force generated by applying a torque on the inner color allows the outer thread and the inner thread to be locked so that the inner collar would not be autonomously screwed out; and the inner and outer threads can be repeatedly used.

The preferred embodiments of the present invention are illustrative only, and the claimed inventions are not limited to the details disclosed in the drawings and the specification. Accordingly, it is intended that it have the full scope permitted by the language of the following claims.

What is claimed is:

1. A low-thermal resistance pressing device for a socket, which is used to be connected to the socket, in which a device to be tested is accommodated, the pressing device comprising:
   a housing, including an axial through hole formed with an internal thread and perforating through an upper surface and a lower surface of the housing;
   an inner collar, accommodated in the axial through hole and formed with an external thread, which is threadedly engaged with the internal thread of the housing;
   a heat conductive pressing block, extending through the inner collar and protruding from the upper surface and the lower surface of the housing;
   a bearing collar, located between the inner collar and the heat conductive pressing block; and
   at least one locking member, assembled on the housing, wherein when the socket is locked by the locking member, rotating the inner collar causes a lower surface of the heat conductive pressing block to be brought into contact with the device to be tested and generates an axial force to the heat conductive pressing block so that the axial force is exerted on the device to be tested through the heat conductive pressing block.

2. The low-thermal resistance pressing device of claim 1, further comprising an outer rotating ring and a pressing ring, wherein the outer rotating ring is coupled to an upper surface of the inner collar, the pressing ring is accommodated in the inner collar between the bearing collar and the heat conductive pressing block, and the heat conductive pressing block extends through the outer rotating ring and the pressing ring.

3. The low-thermal resistance pressing device of claim 2, wherein the heat conductive pressing block includes a coaxial portion and an arc-shaped flared portion; the coaxial portion extends through the pressing ring, the bearing collar, the inner collar and the outer rotating ring; the pressing ring includes an inner circle arc face u which is abutted against the arc-shaped flared portion.

4. The low-thermal resistance pressing device of claim 3, wherein the bearing collar is a thrust bearing; the coaxial portion of the heat conductive pressing block is spaced by a specific clearance from the pressing ring, the bearing collar and the inner collar.

5. The low-thermal resistance pressing device of claim 2, further comprising an upper retaining ring and a lower retaining ring, wherein the upper retaining ring is fitted on the heat conductive pressing block and abutted against the upper surface of the inner collar; the lower retaining ring is assembled on a lower surface of the inner collar for retaining the pressing ring.

6. The low-thermal resistance pressing device of claim 1, wherein the heat conductive pressing block includes a coaxial portion, a stepped portion and an obliquely flared portion, and the stepped portion is located between the coaxial portion and the obliquely flared portion.

7. The low-thermal resistance pressing device of claim 6, further comprising a fixing ring, which is fitted on the coaxial portion of the heat conductive pressing block, wherein the bearing collar is a fish-eye bearing, which includes a bearing inner convex race and a bearing outer concave race; the bearing inner convex race is fitted on the coaxial portion; one end of the bearing inner convex race is abutted against the fixed ring; the other end of the bearing inner convex race is abutted against the stepped portion; the bearing outer concave race is coupled to the bearing inner convex race and connected to the inner collar.

8. The low-thermal resistance pressing device of claim 7, wherein the fixing ring is accommodated in the inner collar, and a specific clearance is maintained between the fixing ring and the inner collar.

9. The low-thermal resistance pressing device of claim b, wherein the bearing collar is spherical roller thrust bearing, which includes an upper race, a lower race and a plurality of oblique rollers; the upper race and the lower race are fitted on the coaxial portion of the heat conductive pressing block; the upper race is connected to the inner collar; the lower race is abutted against the stepped portion; and the plurality of oblique rollers are arranged between the upper race and the lower race.

10. The low-thermal resistance pressing device of claim 1, further comprising a temperature control module, which is arranged above the housing and in contact with the heat conductive pressing block.

* * * * *